(12) United States Patent
Lee

(10) Patent No.: US 11,699,695 B2
(45) Date of Patent: Jul. 11, 2023

(54) SEMICONDUCTOR DEVICE AND METHOD OF DESIGNING SEMICONDUCTOR DEVICE

(71) Applicant: SAMSUNG ELECTRONICS CO., LTD., Suwon-si (KR)

(72) Inventor: Jungpil Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/188,077

(22) Filed: Mar. 1, 2021

(65) Prior Publication Data

US 2022/0037307 A1 Feb. 3, 2022

(30) Foreign Application Priority Data

Jul. 31, 2020 (KR) .................. 10-2020-0095799

(51) Int. Cl.
*H01L 21/00* (2006.01)
*H01L 27/02* (2006.01)
*H01L 23/522* (2006.01)
*H01L 23/48* (2006.01)
*G06F 30/392* (2020.01)

(52) U.S. Cl.
CPC ........ *H01L 27/0207* (2013.01); *H01L 23/481* (2013.01); *H01L 23/5223* (2013.01); *G06F 30/392* (2020.01)

(58) Field of Classification Search
CPC H01L 27/0207; H01L 23/481; H01L 23/5223
See application file for complete search history.

(56) References Cited

U.S. PATENT DOCUMENTS

| 8,264,065 | B2 | 9/2012 | Su et al. | |
|---|---|---|---|---|
| 8,362,622 | B2 | 1/2013 | Sproch et al. | |
| 8,704,375 | B2 | 4/2014 | Liu et al. | |
| 9,087,909 | B2 | 7/2015 | Lin et al. | |
| 9,159,689 | B1 * | 10/2015 | Park | H01L 23/291 |
| 9,536,829 | B2 | 1/2017 | Farooq et al. | |
| 9,691,684 | B2 | 6/2017 | Park et al. | |
| 2002/0004930 | A1 * | 1/2002 | Ohno | G06F 30/39 |
| | | | | 257/E23.079 |
| 2009/0070721 | A1 * | 3/2009 | Solomon | H01L 25/0657 |
| | | | | 716/118 |
| 2009/0111232 | A1 | 4/2009 | Kim et al. | |

(Continued)

FOREIGN PATENT DOCUMENTS

| CN | 112599488 | A | * | 4/2021 | ....... H01L 21/28026 |
| JP | 2021040304 | A | * | 3/2021 | ........... G09G 3/2092 |

*Primary Examiner* — Laura M Menz
(74) *Attorney, Agent, or Firm* — F. Chau & Associates, LLC

(57) ABSTRACT

A semiconductor device includes a first integrated circuit and a second integrated circuit disposed on a semiconductor substrate and spaced apart from each other. A wiring structure is disposed on the semiconductor substrate and electrically connects the first integrated circuit and the second integrated circuit. A first TSV area and a second TSV area are disposed between the first integrated circuit and the second integrated circuit The first and second TSV areas include a plurality of first and second TSV structures penetrating through the semiconductor substrate, respectively. The wiring structure passes between the first TSV area and the second TSV area.

12 Claims, 14 Drawing Sheets

(56) References Cited

U.S. PATENT DOCUMENTS

| | | | |
|---|---|---|---|
| 2012/0163413 A1 | 6/2012 | Kim et al. | |
| 2017/0025384 A1* | 1/2017 | Park | H01L 23/481 |
| 2021/0066191 A1* | 3/2021 | Chen | H01L 23/5226 |
| 2021/0082877 A1* | 3/2021 | Uchiyama | H01L 24/80 |
| 2021/0118805 A1* | 4/2021 | Sio | H01L 21/4857 |
| 2021/0183662 A1* | 6/2021 | Fay | H01L 23/481 |
| 2021/0265280 A1* | 8/2021 | Shih | H01L 21/568 |
| 2021/0391265 A1* | 12/2021 | Jung | H01L 24/73 |
| 2021/0407890 A1* | 12/2021 | Jo | H01L 24/13 |
| 2022/0037236 A1* | 2/2022 | Seo | H01L 23/5226 |
| 2022/0037307 A1* | 2/2022 | Lee | H01L 27/0207 |
| 2022/0068765 A1* | 3/2022 | Kirby | H01L 25/18 |
| 2022/0068819 A1* | 3/2022 | Kirby | H01L 21/50 |
| 2022/0139806 A1* | 5/2022 | Park | H01L 24/10 |
| | | | 257/621 |
| 2022/0181300 A1* | 6/2022 | Liebmann | H01L 25/0657 |
| 2022/0246582 A1* | 8/2022 | Nam | H01L 25/0652 |

\* cited by examiner

SEMICONDUCTOR DEVICE AND METHOD OF DESIGNING SEMICONDUCTOR DEVICE

CROSS-REFERENCE TO RELATED APPLICATION(S)

This application claims priority under 35 U.S.C. § 119 to Korean Patent Application No. 10-2020-0095799 filed on Jul. 31, 2020 in the Korean Intellectual Property Office, the disclosure of which is incorporated herein by reference in its entirety herein.

TECHNICAL FIELD

The present inventive concepts relate to a semiconductor device and a method of designing a semiconductor device.

DISCUSSION OF RELATED ART

A System-In-Package (SIP) having a plurality of semiconductor devices mounted in a single package has been developed. However, the SIP may have an increased size due to the plurality of semiconductor devices and high-speed communications between the plurality of semiconductor devices may be difficult to achieve. The development of a 3D semiconductor device having a plurality of semiconductor devices that are vertically stacked using a Through Silicon Via (TSV) may reduce the area occupied by semiconductor devices in a package and may provide high-speed communications between semiconductor devices.

SUMMARY

Embodiments of the present inventive concepts include a semiconductor device in which a communication speed of a semiconductor device having a TSV is increased and a method of designing a semiconductor device.

According to an embodiment of the present inventive concepts, a semiconductor device includes a first integrated circuit and a second integrated circuit disposed on a semiconductor substrate and spaced apart from each other. A wiring structure is disposed on the semiconductor substrate and is configured to electrically connect the first integrated circuit and the second integrated circuit. A first TSV area and a second TSV area are disposed between the first integrated circuit and the second integrated circuit. The first and second TSV areas include a plurality of first and second TSV structures penetrating through the semiconductor substrate, respectively. The wiring structure passes between the first TSV area and the second TSV area.

According to an embodiment of the present inventive concepts, a semiconductor device includes a semiconductor substrate including a conductive region. A semiconductor structure is on the semiconductor substrate. The semiconductor structure includes a plurality of individual devices that is configured to be electrically connected to the conductive region, and a wiring structure that is configured to be electrically connected to the plurality of individual devices. A plurality of TSV structures penetrates through at least partial portions of the semiconductor substrate and the semiconductor structure. The plurality of TSV structures is arranged in a first direction that is parallel to an upper surface of the semiconductor substrate. The plurality of individual devices includes a plurality of first individual devices and a plurality of second individual devices that are spaced apart by the plurality of TSV structures in a second direction that is perpendicular to the first direction. The wiring structure passes between the plurality of TSV structures in the second direction. The wiring structure is configured to electrically connect at least a partial portion of each of the plurality of first individual devices and the plurality of second individual devices to each other.

According to an embodiment of the present inventive concepts, a semiconductor device includes a first integrated circuit and a second integrated circuit that are spaced apart from each other. A wiring structure is configured to electrically connect the first integrated circuit and the second integrated circuit. A plurality of TSV areas is disposed between the first integrated circuit and the second integrated circuit. The plurality of TSV areas is spaced apart from each other in a first direction and includes a plurality of TSV structures arranged in matrix form. A buried element is disposed in at least a partial portion of the plurality of TSV areas. The buried element is configured to be electrically connected to at least a partial portion of the plurality of TSV structures. The wiring structure passes between the plurality of TSV areas in a second direction that is perpendicular to the first direction.

According to an embodiment of the present inventive concepts, a method of designing a semiconductor device includes determining positions of an input/output area, a first integrated circuit area, a second integrated circuit area, a first TSV area, and a second TSV area within an area of the semiconductor device. A plurality of first TSV structures and a plurality of second TSV structures are disposed in the first TSV area and the second TSV area, respectively. A hard macro is disposed in the first integrated circuit area and the second integrated circuit area, respectively. A plurality of first cells and a plurality of second cells are disposed in the first integrated circuit area and the second integrated circuit area, respectively. The plurality of first cells and the plurality of second cells do not overlap the hard macro. A wiring structure is disposed and passes between the first TSV area and the second TSV area. The wiring structure electrically connects at least partial portions of the hard macro, the plurality of first cells, and the plurality of second cells.

According to an embodiment of the present inventive concepts, a semiconductor device includes a plurality of integrated circuits disposed on a semiconductor substrate and spaced apart from each other. A plurality of TSV areas is spaced apart from each other and is disposed between adjacent integrated circuits of the plurality of integrated circuits. The plurality of TSV areas includes a plurality of TSV structures penetrating through the semiconductor substrate. A wiring structure is disposed on the semiconductor substrate and passes between adjacent TSV areas of the plurality of TSV areas that are nearest to the wiring structure. The wiring structure is configured to electrically connect the plurality of integrated circuits.

BRIEF DESCRIPTION OF DRAWINGS

The above and other aspects, features, and advantages of the present inventive concepts will be more clearly understood from the following detailed description of embodiments thereof, taken in conjunction with the accompanying drawings, in which.

DETAILED DESCRIPTION OF EMBODIMENTS

Hereinafter, embodiments will be described with reference to the accompanying drawings.

Figure 1A:
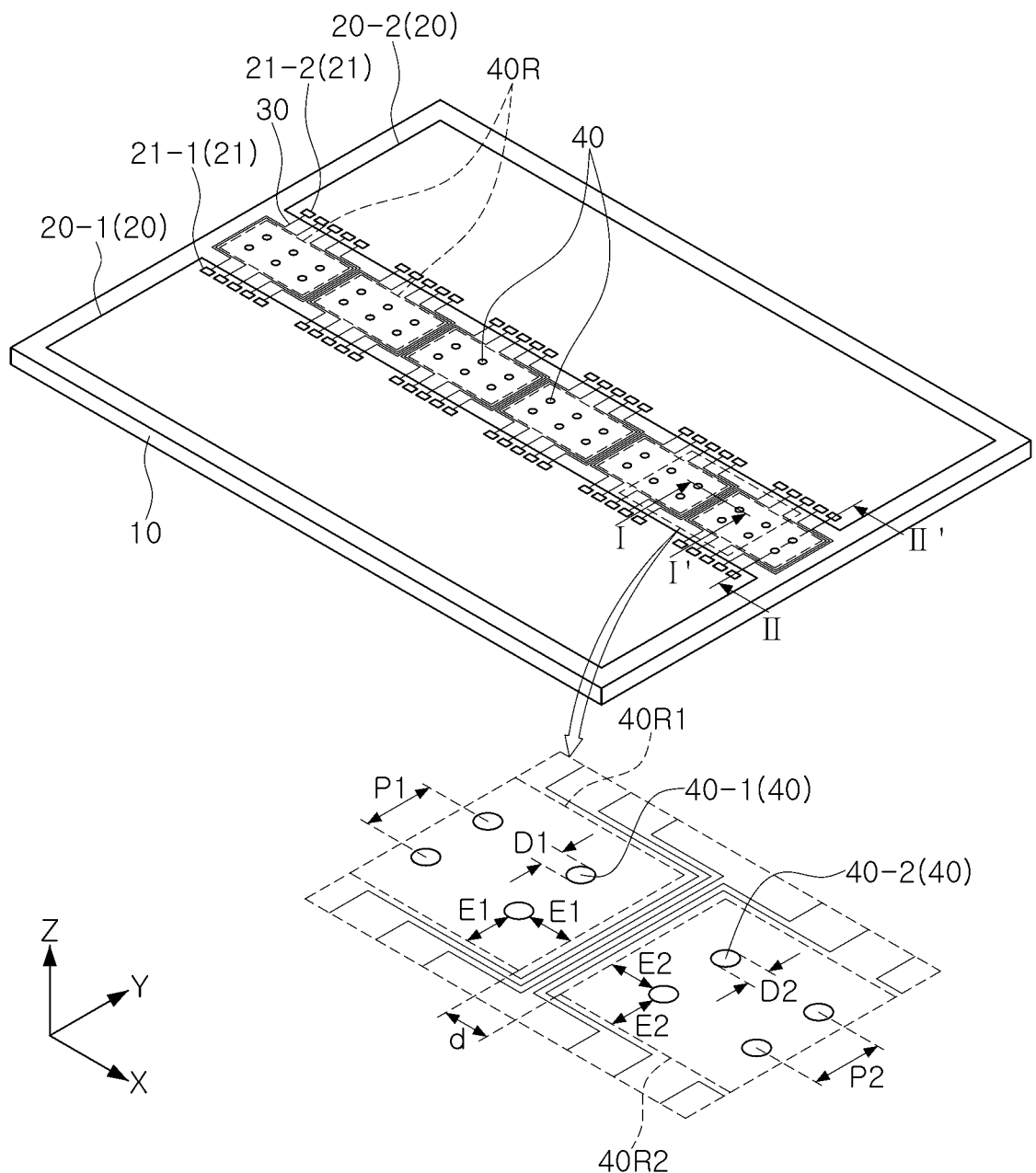
FIG. 1A is a perspective view and an enlarged partial perspective view illustrating a semiconductor device according to embodiments of the present inventive concepts.
Figure 1B:
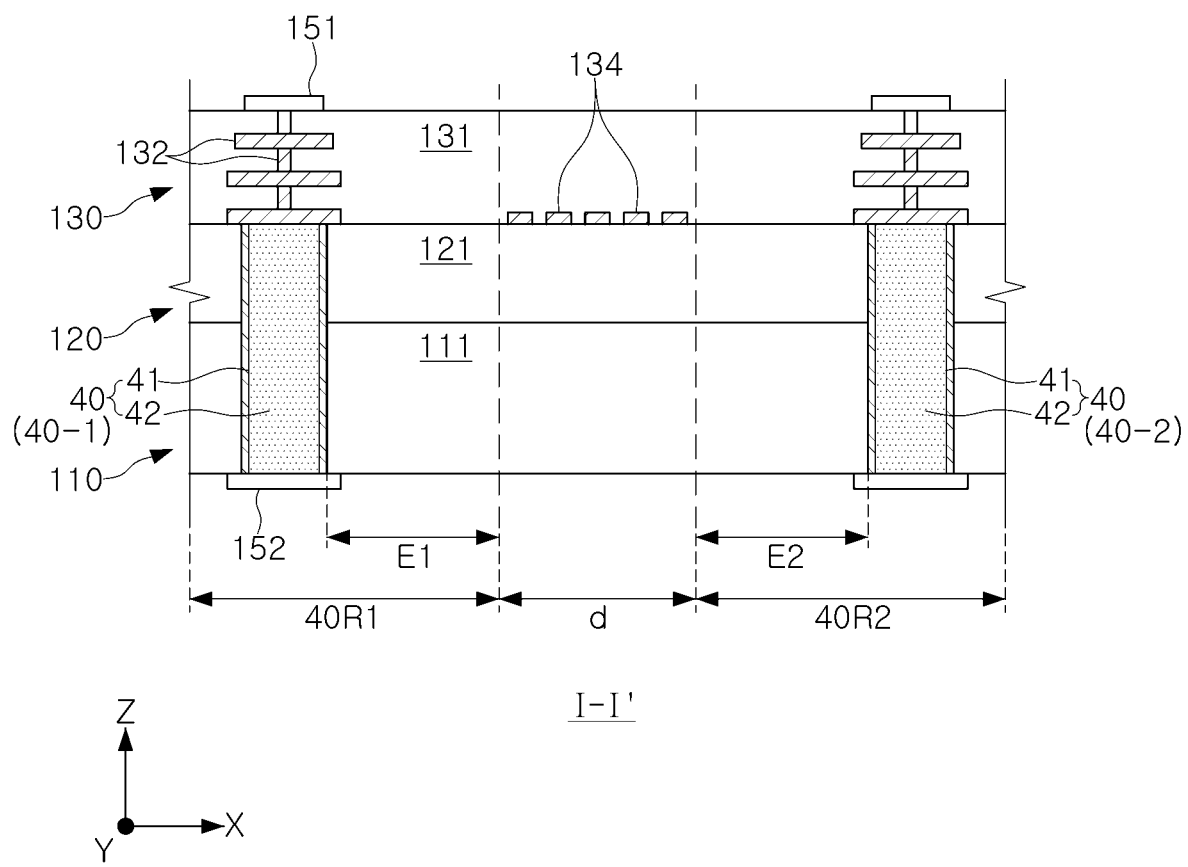
FIG. 1B is a cross-sectional view illustrating a semiconductor device taken along line I-I' of FIG. 1A according to an embodiment of the present inventive concepts.
Figure 1C:
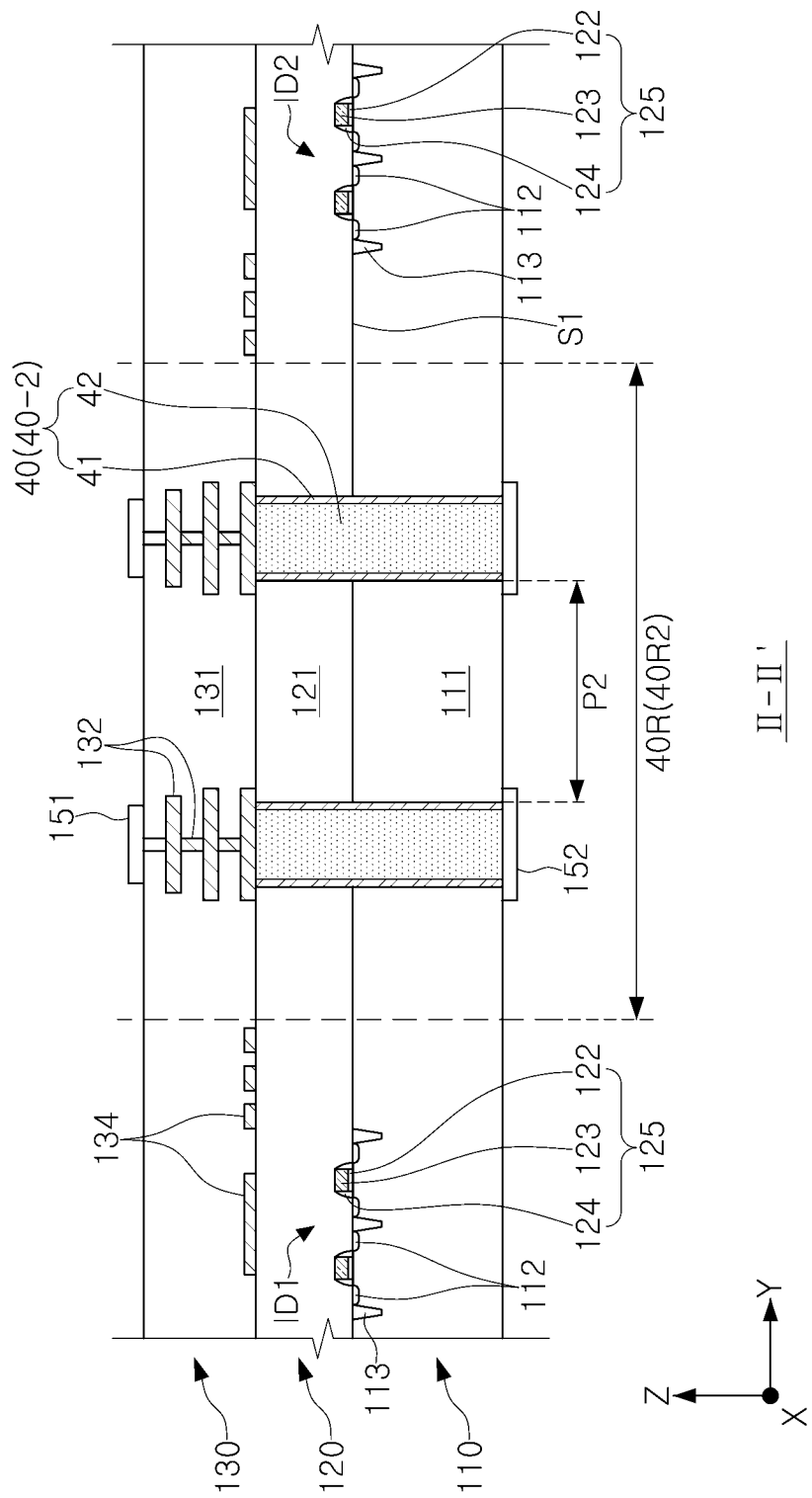
FIG. 1C is a cross-sectional view illustrating a semiconductor device taken along line II-II' of FIG. 1A according to an embodiment of the present inventive concepts.

FIG. 1A is a perspective view and an enlarged partial perspective view illustrating a semiconductor device 100A according to an embodiment of the present inventive concepts. FIG. 1B is a cross-sectional view taken along line I-I' of FIG. 1A, and FIG. 1C is a cross-sectional view taken along line II-II' of FIG. 1A.

Referring to FIG. 1A, the semiconductor device 100A may include a body 10, a plurality of integrated circuits 20, a wiring structure 30, and a plurality of TSV structures 40. As shown in the embodiment of FIG. 1B, the body 10 may include a semiconductor substrate 110 and first and second semiconductor structures 120 and 130 on the semiconductor substrate 110 to be described later.

The plurality of integrated circuits 20 are formed in the body 10 and may be spaced apart from each other by a predetermined distance. For example, the plurality of integrated circuits 20 may include a first integrated circuit 20-1 and a second integrated circuit 20-2 spaced apart from each other. For example, as shown in the embodiment of FIG. 1A, the first integrated circuit 20-1 and the second integrated circuit 20-2 may be spaced apart from each other in a second direction extending along the Y axis (hereinafter, the "Y direction") which is parallel to an upper surface of the semiconductor substrate 110. In an embodiment, the first integrated circuit 20-1 and the second integrated circuit 20-2 may include a logic circuit including a logic cell or a memory circuit (or a memory block) including a memory cell.

For example, in an embodiment the first integrated circuit 20-1 may include a plurality of first logic cells 21-1, and the second integrated circuit 20-2 may include a plurality of second logic cells 21-2, The plurality of first logic cells 21-1 and the plurality of second logic cells 21-2 that are spaced apart from each other (e.g., in the Y direction) may be electrically connected to each other through the wiring structure 30. In an embodiment, the first integrated circuit 20-1 and the second integrated circuit 20-2 may include a logic circuit such as a central processing unit (CPU), a graphics processing unit (GPU), and a field programmable gate array (FPGA), a digital signal processor (DSP), an encryption processor, a microprocessor, a microcontroller, an analog-digital converter, an application-specific integrated circuit (ASIC), and the like. However, embodiments of the present inventive concepts are not limited thereto.

The wiring structure 30 may electrically connect the plurality of integrated circuits 20 spaced that are apart from each other. The wiring structure 30 may pass between a plurality of TSV structures 40 arranged in a first direction that extends along the X axis (hereinafter, the "X direction") which is parallel to an upper surface of the semiconductor substrate 110 and is perpendicular to the Y direction. The wiring structure 30 electrically connects the plurality of integrated circuits 20 spaced apart from each other. The wiring structure 30 may pass between a plurality of TSV areas 40R that are spaced apart from each other (e.g., in the X direction) to connect the first integrated circuit 20-1 and the second integrated circuit 20-2 by a relatively shortest distance. For example, as shown in the enlarged partial perspective view in FIG. 1A, the wiring structure 30 passes between a first TSV area 40R1 and a second ISV area 40R2 of the plurality of TSV areas 40R which are adjacent to each other (e.g., in the X direction) to electrically connect the first integrated circuit 20-1 and the second integrated circuit 20-2 without extending within the first TSV area 40R1 or the second TSV area 40R2. For example, the wiring structure 30 may electrically connect the first integrated circuit 20-1 and the second integrated circuit 20-2 while bypassing both ends of the plurality of respective TSV areas 40R. As shown in the embodiment of FIG. 1A, the wiring structure 30 may pass a space between the plurality of nearest TSV areas 40R to connect the first integrated circuit 20-1 and the second integrated circuit 20-2 by a relatively shortest distance. Therefore, the wiring structure 30 may not be concentrated on one lateral side or both lateral sides of a partial portion of the TSV areas 40R, but may be formed to pass through both lateral sides of each of the plurality of respective TSV areas 40R. The wiring structure 30 may be comprised of a via and a wiring layer inside the body 10. The wiring structure 30 may further include a portion connecting the cells in the first integrated circuit 20-1 to each other or connecting the cells in the second integrated circuit 20-2 to each other, in addition to a portion electrically connecting the first integrated circuit 20-1 and the second integrated circuit 20-2.

As shown in the embodiment of FIG. 1A, the plurality of TSV structures 40 may be disposed in a matrix form in the plurality of TSV areas 40R that are spaced apart from each other. For example, the first TSV area 40R1 may include a plurality of first TSV structures 40-1 disposed in an m×n matrix form, and the second TSV area 40R2 may include a plurality of second TSV structures 40-2 disposed in an i×j matrix form. The first TSV area 40R1 and the second TSV area 40R2 are disposed between the first integrated circuit 20-1 and the second integrated circuit 20-2 (e.g., in the Y direction), and may be spaced apart from each other in the X direction. The aforementioned "m" and "i" denote the number of the plurality of first TSV structures 40-1 and the number of the plurality of second TSV structures 40-2 arranged in the X direction, respectively, the same as the arrangement direction of the first TSV area 40R1 and the second TSV area 40R2, respectively. The aforementioned "it" and "j" denote the number of the plurality of first TSV structures 40-1 and the number of the plurality of second TSV structures 40-2 arranged in the Y direction perpendicular to the X direction. In an embodiment, "m" and "i" may be the same integer that is greater than or equal to 2, and "n" and "j" may be the same integer that is greater than or equal to 2. However, embodiments of the present inventive concepts are not limited thereto.

The plurality of first TSV structures 40-1 and the plurality of second TSV structures 40-2 may be arranged to have substantially the same pitch. For example, a first interval P1 between the centers of adjacent first TSV structures (e.g., adjacent in the Y direction) among the plurality of first TSV structures 40-1 and a second interval P2 between the centers of adjacent second TSV structures (e.g., adjacent in the Y direction) among the plurality of second TSV structures 40-2 may be substantially the same as each other. In an embodiment, each of the first and second intervals P1 and P2 may be in a range from about 30 μm to about 50 μm. However, embodiments of the present inventive concepts are not limited thereto.

The first TSV area 40R1 and the second TSV area 40R2 may be keep-out zones which the formation of elements such as transistors is prohibited around the TSV structure 40, to prevent cracks or deterioration of the device function due to stress acting on the TSV structure 40 and surroundings thereof. For example, the first TSV area 40R1 may be an area corresponding to a range within a first distance E1 (e.g., length in each of the X direction and the Y direction) from a first am TSV structure that is disposed on an outer side among the plurality of first TSV structures 40-1, and the second TSV area 40R2 may be an area corresponding to a range within a second distance E2 (e.g., length in each of the X direction and Y direction) from a first second TSV structure that is disposed on an outer side among the plurality of second TSV structures 40-2. In an embodiment, the first distance E1 and the second distance E2 may respectively be in a range of about 20 μm to about 40 μm from the TSV structure 40. A relatively large number of TSV structures 40 may be required for high-speed communications between semiconductor devices which may result in an increase of the area of the TSV area 40R. To significantly reduce the burden caused by the increase in the area of the TSV area 40R, an interval d (e.g., length in the X direction) between the first TSV area 40R1 and the second TSV area 40R2 through which the wiring structure 30 having a fine pitch passes may be less than or equal to each of the first distance E1 and the second distance E2.

The plurality of TSV structures 40 may penetrate through at least a portion of the body 10. For example, as shown in the embodiment of FIG. 1B, the plurality of TSV structures 40 may penetrate through at least a portion of the body 10 in a third direction that extends along the Z axis (hereinafter, the "Z direction) which is perpendicular to the X and Y directions and is a thickness direction of the semiconductor substrate 110. For example, each of the TSV structures 40 may have a cylindrical shape penetrating through the body 10, and the plurality of first TSV structures 40-1 and the plurality of second TSV structures 40-2 may each have a diameter in a range of about 3 μm to about 5 μm. The integrated circuit 20 may be electrically connected to an integrated circuit of another semiconductor device to be stacked on and/or below the semiconductor device 100A, through the plurality of TSV structures 40.

Each of the semiconductor devices constituting the 3D semiconductor device may include TSV structures electrically connecting the semiconductor devices to each other. By securing a space between the first and second TSV areas in which TSV structures are concentrated, a path of a wiring connecting the first and second integrated circuits separated by the TSV area may be reduced. In an embodiment, the first TSV area 40R1 and the second TSV area 40R2 that are spaced apart in the X direction may he disposed between the first integrated circuit 20-1 and the second integrated circuit 20-2 spaced apart in the Y direction. In addition, the wiring structure 30 passes (e.g., extends longitudinally) between the first TSV area 40R1 and the second TSV area 40R2 in the Y direction, to electrically connect the first integrated circuit 20-1 and the second integrated circuit 20-2 to each other.

Referring to the embodiments of FIGS. 1A and 1C and 1C, the semiconductor device 100A may include a semiconductor substrate 110, first and second semiconductor structures 120 and 130, and a plurality of TSV structures 40.

The semiconductor substrate 110 may include a semiconductor layer 111, and a plurality of conductive regions 112 and isolation regions 113 formed in the semiconductor layer 111. In an embodiment, the semiconductor substrate 110 may be a semiconductor wafer. In an embodiment, the semiconductor layer 111 may include a semiconductor element such as silicon or germanium, or a compound semiconductor such as silicon carbide (SiC), gallium arsenide (GaAs), indium arsenide (InAs), and indium phosphide (InP). The conductive region 112 may be, for example, a well doped with impurities or a structure doped with impurities. The isolation region 113 is a device isolation structure having a shallow trench isolation (STI) structure, and may include silicon oxide or the like. The lower surface of the semiconductor substrate 110 may be covered with an insulating layer formed of a silicon oxide film, a silicon nitride film, a polymer, or a combination thereof.

The semiconductor structures may include the first semiconductor structure 120 and the second semiconductor structure 130 stacked on the semiconductor substrate 110. The first semiconductor structure 120 may include a first interlayer insulating layer 121 and a plurality of individual devices, such as a first individual device ID1 and a second individual device ID2 disposed on an upper surface S1 of the semiconductor substrate 110. The plurality of individual devices, such as the first and second individual devices ID1 and ID2, may be combined with each other to form the integrated circuit 20 of FIG. 1A. In an embodiment, the first interlayer insulating layer 121 may include silicon oxide or silicon nitride. In an embodiment, the plurality of individual devices, such as the first individual device ID1 and the second individual device ID2 may include a variety of microelectronic devices, for example, metal-oxide-semiconductor field effect transistor (MOSFET), a system large scale integration (LSI), a micro-electro-mechanical system (MEMS), an active element, a passive element, and the like. In an embodiment, the plurality of individual devices, such as the first individual device ID1 and the second individual device ID2 may include a gate structure 125. As shown in the embodiment of FIG. 1C, the gate structure 125 may include a gate insulating layer 122 disposed on the semiconductor substrate 110, a gate electrode 123 disposed on the gate insulating layer 122, and a gate spacer 124 surrounding the gate insulating layer 122 and the gate electrode 123. In an embodiment, the gate insulating layer 122 may include silicon oxide or silicon nitride. The gate electrode 123 may include a metal oxide or a metal material. The gate spacer 124 may be formed of a silicon nitride film, a SiOCN film, a SiCN film, or a combination thereof. The plurality of individual devices, such as the first individual device ID1 and the second individual device ID2 may be electrically connected to the conductive region 112 of the semiconductor substrate 110. Each of the plurality of individual devices, such as the first individual device ID1 and the second individual device ID2, may be electrically separated from other adjacent individual devices by the first interlayer insulating layer 121, respectively.

The second semiconductor structure 130 may include a second interlayer insulating layer 131 disposed on the first semiconductor structure 120, and first and second wiring structures 132 and 134 comprised of a metal wiring layer and a contact via. In addition to the first and second wiring structures 132 and 134, the second semiconductor structure 130 may further include a plurality of wiring structures connecting the individual devices, such as the first individual device ID1 and the second individual device ID2, of the first semiconductor structure 120 to each other or connected to other individual devices or wirings. The second interlayer insulating layer 131 may be disposed on the first semiconductor structure 120 and may include silicon oxide or silicon nitride. The first wiring structure 132 is disposed on the TSV structure 40, and may electrically connect the TSV structure 40 and an upper connection terminal 151. For example, as shown in the embodiment of FIG. 1C, a lower surface of the first wiring structure 132 directly contacts an upper surface of the TSV structure 40 and an upper surface of the first wiring structure 132 directly contacts a lower surface of the upper connection terminal 151. The second wiring structure 134 may extend longitudinally in the Y direction to electrically connect the plurality of individual devices, such as the first individual device ID1 and the second individual device ID2, which are separated by the TSV area 40R. In an embodiment, the second wiring structure 134 may be formed as a multilayer wiring structure including a plurality of metal wiring layers and a plurality of contact vias.

In an embodiment, the plurality of individual devices may be separated into a plurality of first individual devices ID1 and a plurality of second individual devices ID2 that are spaced apart from each other in the Y direction by the TSV structures 40. In addition, the plurality of first individual devices ID1 and the plurality of second individual devices ID2 may be electrically connected to each other through the second wiring structure 134 passing between the first TSV structure 40-1 and the second TSV structure 40-2 in the Y direction. The second wiring structure 134 may not overlap the TSV area 40R1 within the first distance E1 from the first TSV structure 40-1 disposed on an outer side among the plurality of first TSV structures 40-1, and the second TSV area 40R2 within the second distance E2 from the second TSV structure 40-2 disposed on an outer side among the plurality of second TSV structures 40-2. The second wiring structure 134 passes between the first TSV structure 40-1 and the second TSV structure 40-2 to reduce a total length of the connection path between the first individual device ID1 and the second individual device ID2 and to increase the communication speed between the first individual device ID1 and the second individual device ID2.

The plurality of TSV structures 40 may penetrate through the semiconductor substrate 110 and the first semiconductor structure 120 in the Z direction. The plurality of TSV structures 40 may be arranged in the X direction. The plurality of TSV structures 40 may include a conductive plug 42 and a barrier layer 41 surrounding the conductive plug 42. In an embodiment, the conductive plug 42 may include a metallic material such as at least one compound selected from tungsten (W), titanium (Ti), aluminum (Al) and copper (Cu). The conductive plug 42 may be formed by a plating process, a PVD process, or a CVD process. The barrier layer 41 may include a metal compound such as at least one compound selected from tungsten nitride (WN), titanium nitride (TiN) and tantalum nitride (TaN). The barrier layer 41 may be formed by a PVD process or a CVD process.

The semiconductor device 100A may further include an upper connection terminal 151 on the second semiconductor structure 130, and a lower connection terminal 152 below the semiconductor substrate 110. For example, as shown in the embodiment of FIGS. 1B and 1C, an upper surface of the lower connection terminal 152 may directly contact a lower surface of the semiconductor substrate 110 and a lower surface of the TSV structure 40 penetrating therethrough and a lower surface of the upper connection terminal 151 may directly contact an upper surface of the second semiconductor structure 130. The upper connection terminal 151 and the lower connection terminal 152 may be electrically connected to each other through the TSV structure 40 and the first wiring structure 132. In embodiments of the present inventive concepts, the upper connection terminal 151 and the lower connection terminal 152 are not limited to the shapes illustrated in the drawings, and may have a shape of a solder ball, a solder bump, or a pad. Additionally, in an embodiment, at least one of the upper connection terminal 151 and the lower connection terminal 152 may be omitted.

Figure 2A:
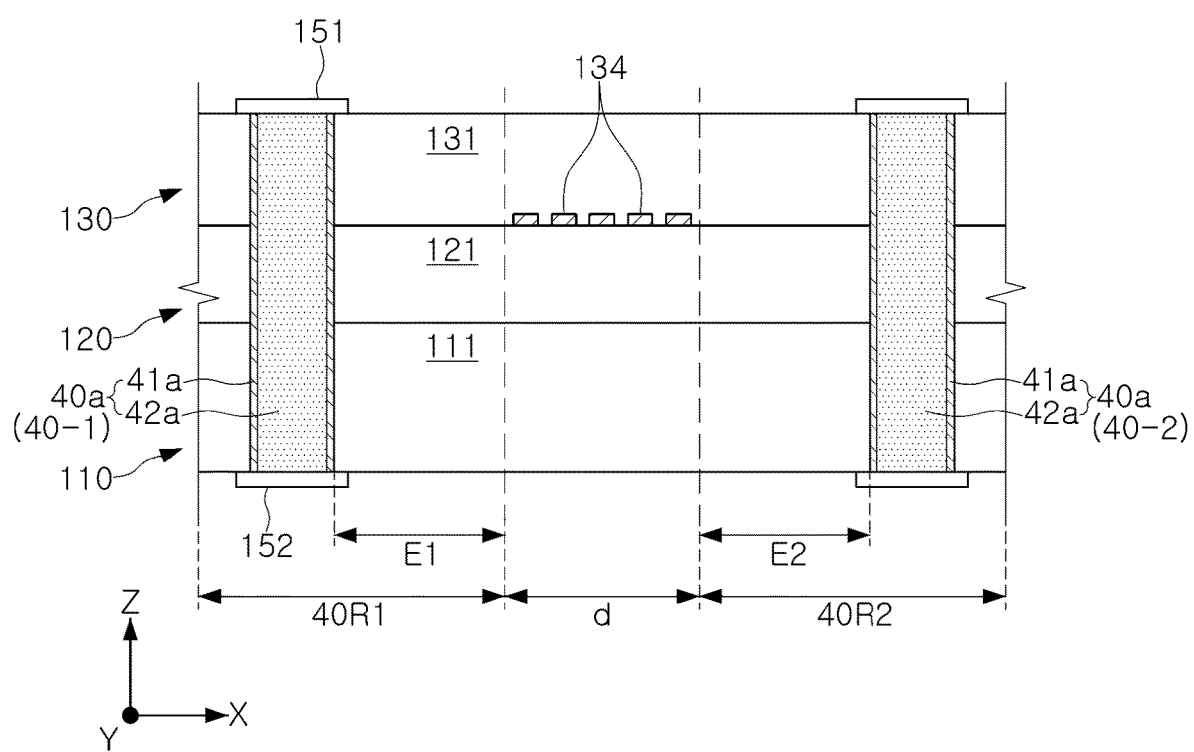
FIGS. 2A to 2B are cross-sectional views illustrating some of components illustrated in FIG. 1B according to embodiments of the present inventive concepts.
Figure 2B:
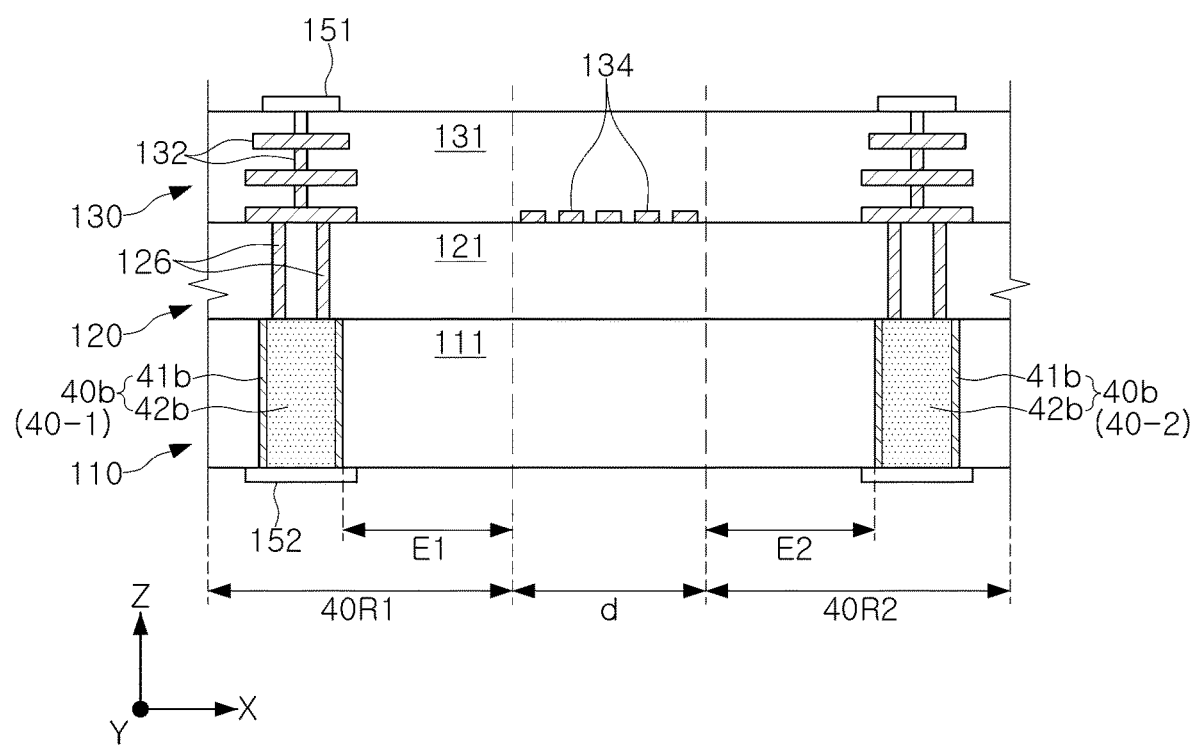

FIGS. 2A to 2B are cross-sectional views illustrating the components illustrated in FIG. 1B, respectively according to embodiments of the present inventive concepts. FIGS. 2A to 2B illustrate the TSV structure 40 of FIG. 1B according to embodiments of the present inventive concepts.

Referring to the embodiment of FIG. 2A, a TSV structure 40a may be formed after the first and second semiconductor structures 120 and 130 are formed on the semiconductor substrate 110. Accordingly, the TSV structure 40a may penetrate (e.g., in the Z direction) the entire thicknesses of the semiconductor substrate 110 and the first and second semiconductor structures 120 and 130. An upper surface of the TSV structure 40a may directly contact a lower surface of the upper connection terminal 151 and a lower surface of the TSV structure 40a may directly contact an upper surface of the lower connection terminal 152. However, the connection structure between the TSV structure 40a and the upper and lower connection terminals 151 and 152 is not limited to the structure illustrated in FIG. 2A. For example, in an embodiment, an upper surface of the TSV structure 40a may not directly contact the upper connection terminal 151 and an upper wire connecting the TSV structure 40a and the upper connection terminal 151 may be further formed on the second semiconductor structure 130.

Referring to the embodiment of FIG. 2B, a TSV structure 40b may be formed before the first and second semiconductor structures 120 and 130 are formed. Accordingly, the TSV structure 40b may penetrate (e.g., in the Z direction) through only the semiconductor substrate 110 and may not penetrate through the first and second semiconductor structures 120 and 130. The TSV structure 40b may be connected to a first wiring structure 132 of the second semiconductor structure 130 through a third wiring structure 126 formed in the first semiconductor structure 120. In the embodiment shown in FIG. 2B, a lower surface of third wiring structure 126 may directly contact an upper surface of the TSV structure 40b and the via-shaped third wiring structure 126 is directly connected to the TSV structure 40b. However, embodiments of the present inventive concepts are not limited to the connection structure between the TSV structure 40b and the third wiring structure 126 shown in FIG. 2B. For example, the third wiring structure 126 may further include a wiring or a pad-shaped metal wiring layer covering the upper surface of the TSV structure 40b.

Figure 3A:
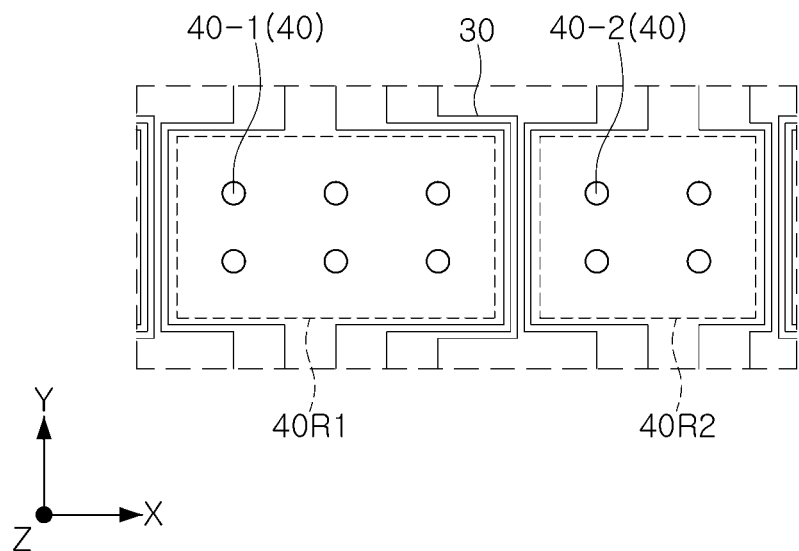
FIGS. 3A to 3C are partially enlarged views illustrating a portion of components of a semiconductor device according to embodiments of the present inventive concepts.
Figure 3B:
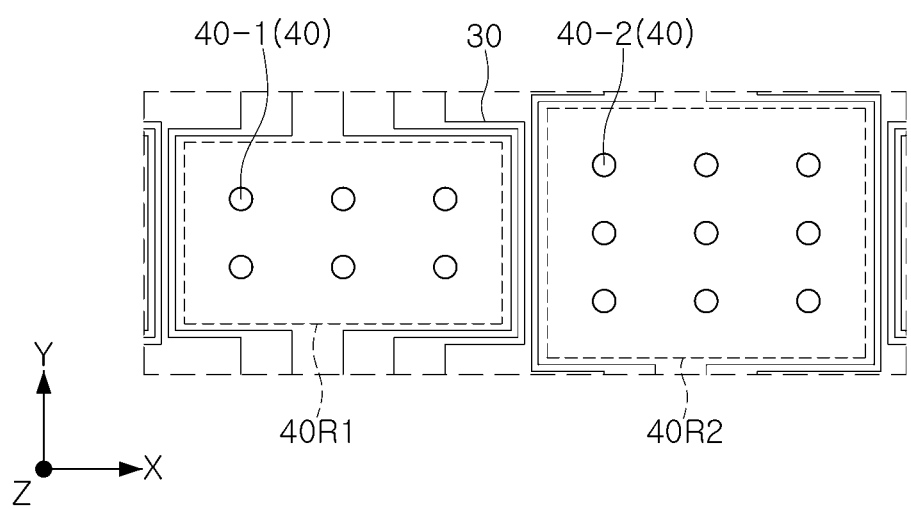
Figure 3C:
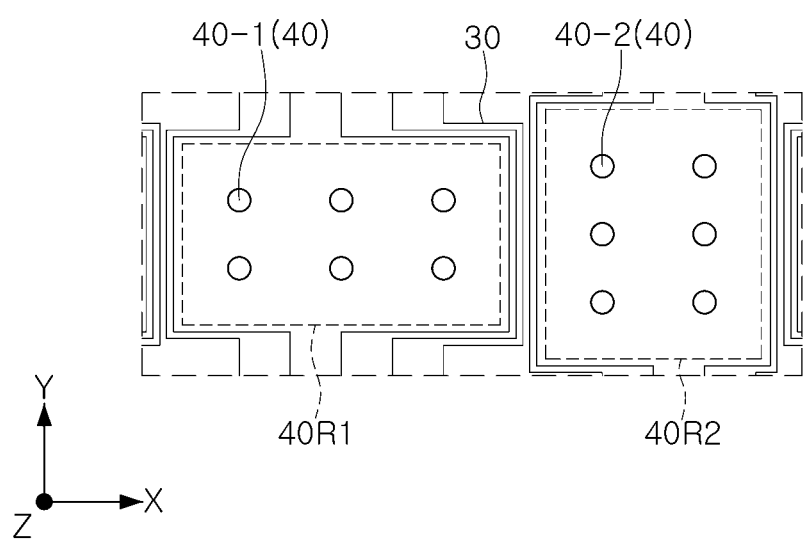

FIGS. 3A to 3C are partially enlarged views illustrating some of the components of semiconductor devices 100a, 100b and 100c, respectively, according to embodiments of the present inventive concepts. FIGS. 3A to 3C are partially enlarged views illustrating first and second TSV areas 40-1 and 40-2 of the semiconductor devices 100a, 100b and 100c.

Referring to the embodiment of FIG. 3A, in the semiconductor device 100a, first TSV structures 40-1 in a first TSV area 40R1 are arranged in an m×n matrix form, and second TSV structures 40-2 in a second TSV area 40R2 may be arranged in the form of an i×j matrix. In this embodiment, "m" and "i" may include different integers that are greater than or equal to 2, and "n" and "j" may include the same integer that is greater than or equal to 2. "m" and "i" are respectively the number of TSV structures 40 arranged in the X direction, and "n" and "j" are respectively the number of TSV structures 40 arranged in the Y direction. For example, as shown in the embodiment of FIG. 3A, "n" and "j" may be 2, "m" may be 3, and "i" may be 2.

Referring to the embodiment of FIG. 3B, in the semiconductor device 100b, first TSV structures 40-1 in the first TSV area 40R1 are arranged in an m×n matrix form, and second TSV structures 40-2 in the second TSV area 40R2 may be arranged in the form of an i×j matrix. In this embodiment, "m" and "i" may include the same integer that is greater than or equal to 2, and "n" and "j" may include different integers that are greater than or equal to 2. "m" and "i" are the number of TSV structures 40 arranged in the X direction, respectively, and "n" and "j" are the number of TSV structures arranged in the Y direction, respectively. For example, as shown in FIG. 3B, "m" and "i" may be 3, "n" may be 2, and "j" may be 3.

Referring to the embodiment of FIG. 3C, in the semiconductor device 100c, first TSV structures 40-1 in the first TSV area 40R1 are arranged in an m×n matrix form, and second TSV structures 40-2 in the second TSV area 40R2 may be arranged in the form of an i×j matrix. In this embodiment, "m" and "i" may include different integers that are greater than or equal to 2, and "n" and "j" may include different integers that are greater than or equal to 2. "m" and "i" are the number of TSV structures 40 arranged in the X direction, respectively, and "n" and "j" are the number of TSV structures 40 arranged in the Y direction, respectively. For example, as shown in the embodiment of FIG. 3C, "m" may be 3, "i" may be 2, "n" may be 2, and "j" may be 3.

In some embodiments, the size of the matrix comprised of the plurality of TSV structures 40 may be variously modified, and the sizes of the plurality of TSV areas 40R may be different from each other. In some embodiments, the arrangements of the plurality of TSV structures 40 may include two or more of the arrangements shown in FIGS. 1A and 3A-3C. A cell arrangement space may be efficiently designed by changing the shape and size of the plurality of TSV areas 40R.

Figure 4:
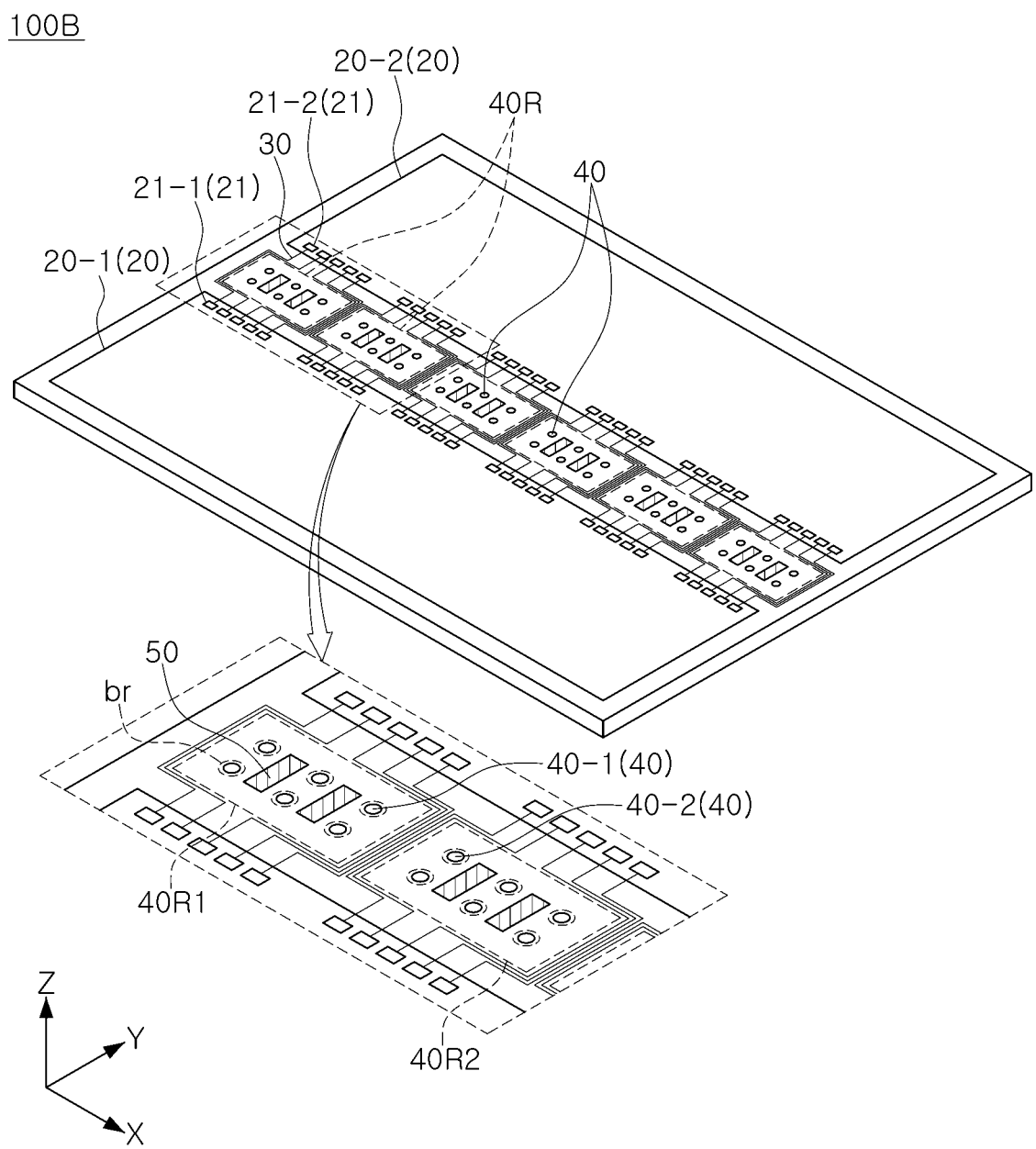
FIG. 4 is a perspective view and an enlarged partial perspective view illustrating a semiconductor device according to an embodiment of the present inventive concepts.
Figure 5:
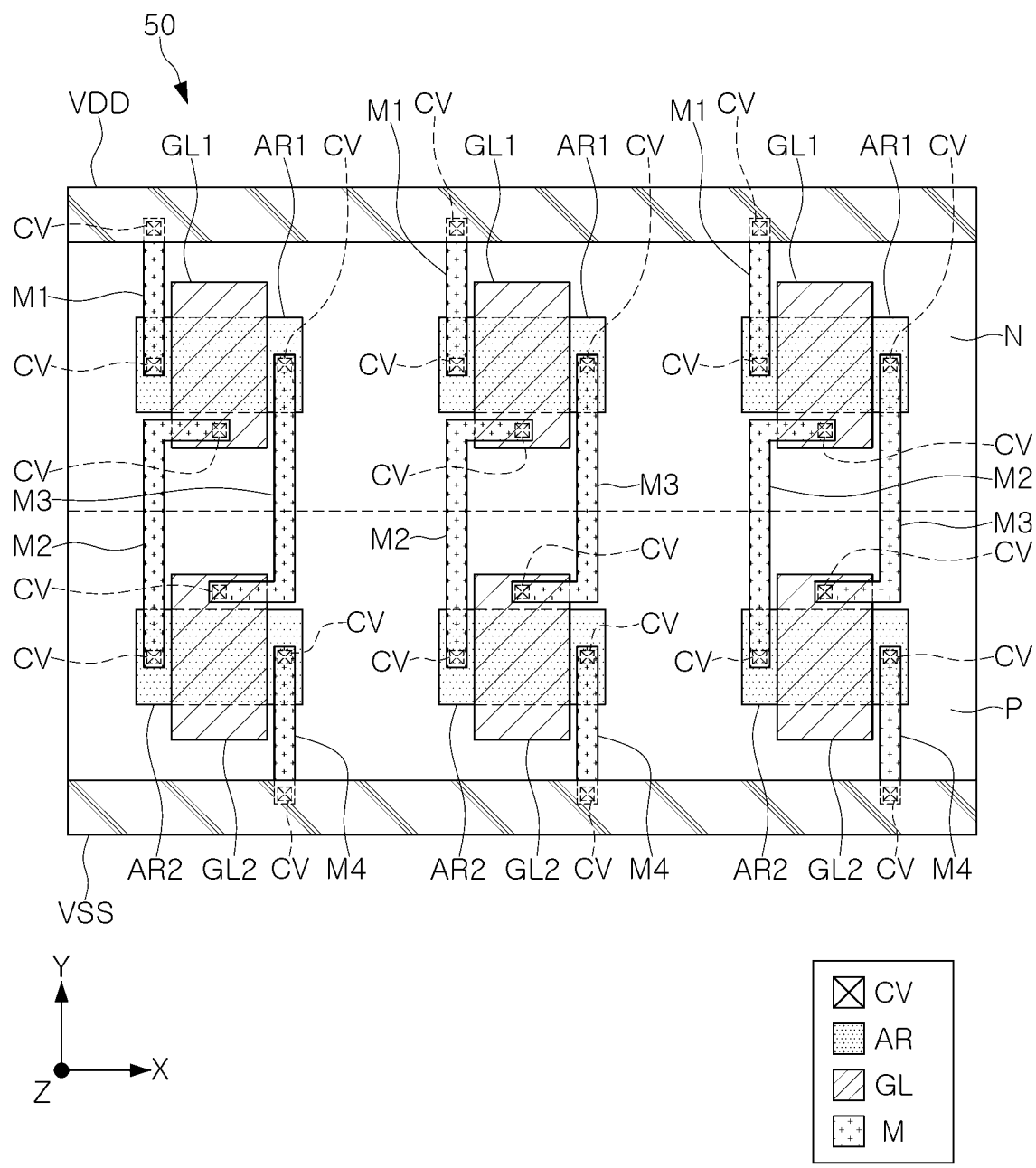
FIG. 5 is a layout view illustrating a portion of components included in the semiconductor device of FIG. 4 according to an embodiment of the present inventive concepts.

FIG. 4 is a perspective view and enlarged partial perspective view illustrating a semiconductor device 100B according to an embodiment of the present inventive concepts, and FIG. 5 is a layout illustrating a portion of buried element 50 included in the semiconductor device 100B of FIG. 4. FIG. 5 illustrates a layout of a decoupling capacitor, which is an example of a buried element 50 of FIG. 4.

Referring to the embodiment of FIG. 4, the semiconductor device 100B may further include a buried element 50 disposed in the TSV area 40R. By disposing the buried element 50 in the TSV area 40R, the area efficiency of the semiconductor device may be increased. The buried element 50 is disposed in at least a partial portion of the plurality of TSV areas 40R, and may be electrically connected to at least a partial portion of the plurality of TSV structures 40. As shown in the embodiment of FIG. 4, the buried element 50 may be disposed so that it does not overlap a barrier region br of the TSV structure 40. The barrier region br may be disposed in a range within a predetermined radius around the TSV structure 40. In an embodiment, the barrier region br may be disposed within a radius in the range of about 10 μm to about 20 μm from the TSV structure 40. The buried element 50 may be connected to a ground and/or a power source through the TSV structure 40. The buried element 50 may be electrically connected to a corresponding TSV structure 40 through an additional wiring structure disposed on the buried element 50 and/or the TSV structure 40. In an embodiment, the buried element 50 may include a decoupling capacitor or a dummy cell. For example, the decoupling capacitor may include at least one of a planar transistor, a recess channel array transistor (RCAT), and a buried cell array transistor (BCAT).

The dummy cell may include, for example, an Engineering Change Order (ECO) cell. The ECO cell may include a programmed function cell and an unprogrammed basic cell. The ECO cell may be insulated from first cells 21-1 and second cells 21-2 included in the integrated circuit 20. The ECO cell may be routed with standard cells in the integrated circuit 20 when modifying the layout of the semiconductor device.

In an embodiment, the decoupling capacitor may have the layout illustrated in FIG. 5. Referring to the embodiment of FIG. 5, the decoupling capacitor may include a pair of power wiring layers, such as first and second power wiring layers VDD and VSS, first and second active regions AR1 and AR2, a gate line, a plurality of contact vias CV, and a plurality of connection wiring layers, such as first to fourth wiring layers M1, M2, M3 and M4. The decoupling capacitor may increase the voltage drop (e.g., an IR drop) of the power supply and remove power supply noise. The area efficiency of the semiconductor device may be increased by disposing the decoupling capacitor in the TSV area 40R.

The pair of power wiring layers, such as the first and second power wiring layers VDD and VSS extend longitudinally in the X direction and may be arranged parallel to each other in the Y direction. The power wiring layers, such as the first and second power wiring layers VDD and VSS may supply power to the integrated circuit 20. In an embodiment, the power wiring layers may include the first power wiring layer VDD supplying a positive voltage and a second power wiring layer VSS supplying a negative voltage. The first and second power wiring layers VDD and VSS may be electrically connected to at least a partial portion of the TSV structures 40.

The first and second active regions AR1 and AR2 extend longitudinally in the X direction between the first and second power wiring layers VDD and VSS, and may be arranged parallel to each other in the Y direction. The first active region AR1 and the second active region AR2 may be spaced apart from each other in the Y direction, and may have different conductivity types. An area other than the first active region AR1 and the second active region AR2 may be a well region doped with impurities. For example, in an embodiment, an area overlapping the first active region AR may be an n-well (N) area, and an area overlapping the second active region AR2 may be a p-well (P) area.

The gate lines GL may extend in the Y direction, on the first and second active regions AR1 and AR2, and may be disposed parallel to each other in the X direction. The gate lines GL may include a first gate line GL1 overlapping the first active region AR1 (e.g., in the Z direction) and a second gate line GL2 overlapping the second active region AR2 (e.g., in the Z direction).

The plurality of connection wiring layers M may include a first connection wiring layer M1 connecting the first active region AR1 and the first power wiring layer VDD, a second connection wiring layer M2 connecting the second active region AR2 and the first gate line GL1, a third connection wiring layer M3 connecting the first active region AR1 and a second gate line GL2, and a fourth connection wiring layer M4 connecting the second active region AR2 and the second power wiring layer VSS. In an embodiment, the connection wiring layer M may have a single layer structure or a multilayer structure including wiring layers of different levels.

The contact vias CV may connect the gate line GL, the first and second active regions AR1 and AR2, the first and second power wiring layers VDD and VSS, and a plurality of connection wiring layers, such as the first to fourth connection wiring layers M1 and M2, M3, M4, disposed on different levels.

Figure 6:
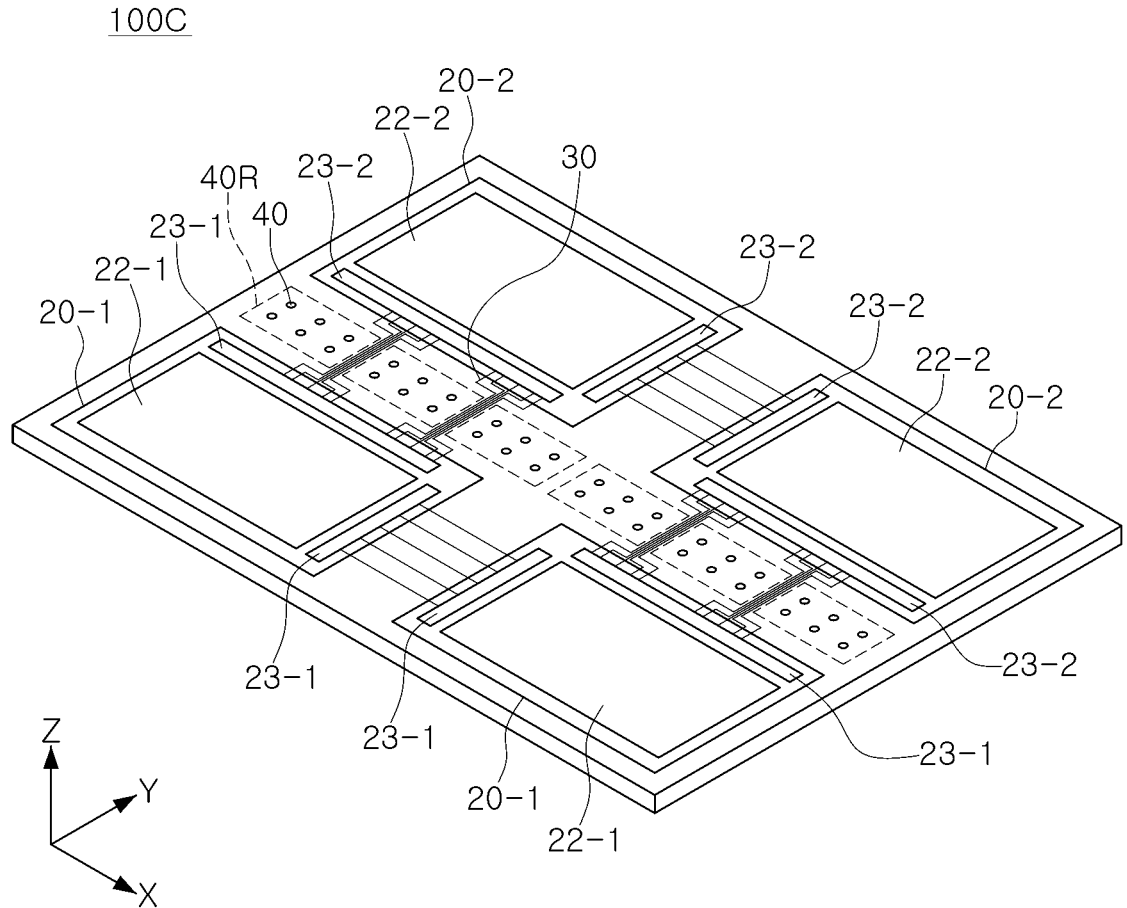
FIG. 6 is a perspective view illustrating a semiconductor device according to an embodiment of the present inventive concepts.

FIG. 6 is a perspective view illustrating a semiconductor device 100C according to an embodiment of the present inventive concepts.

Referring to the embodiment of FIG. 6, in the semiconductor device 100C, a first integrated circuit 20-1 may include a first memory block 22-1 and a first peripheral circuit 23-1, and a second integrated circuit 20-2 may include a second memory block 22-2 and a second peripheral circuit 23-2. The first peripheral circuit 23-1 may be electrically connected to the first memory block 22-1. The second peripheral circuit 23-2 may be electrically connected to the second memory block 22-2. In addition, the first peripheral circuit 23-1 and the second peripheral circuit 23-2 may be electrically connected to each other through a wiring structure 30 passing between the TSV areas 40R. The first and second memory blocks 22-1 and 22-2 may include a plurality of memory cells, a plurality of word lines, and a plurality of bit lines. In an embodiment, the semiconductor device 100C may be, for example, a volatile memory device such as dynamic random access memory (DRAM) or a static RAM (SRAM), or a nonvolatile memory device such as a phase change RAM (PRAM), a magnetic RAM (MRAM), a resistive RAM (RRAM), a flash memory, and the like.

The wiring structure 30 may pass between the TSV areas 40R spaced apart from each other without extending within the TSV areas 40R to reduce a total length of a connection path between the first peripheral circuit 23-1 and the second peripheral circuit 23-2. By connecting the first peripheral circuit 23-1 and the second peripheral circuit 23-2, a multi-plane operation of the first and second memory blocks 22-1 and 22-2 separated by the TSV areas 40R may be performed at a relatively high speed.

Figure 7:
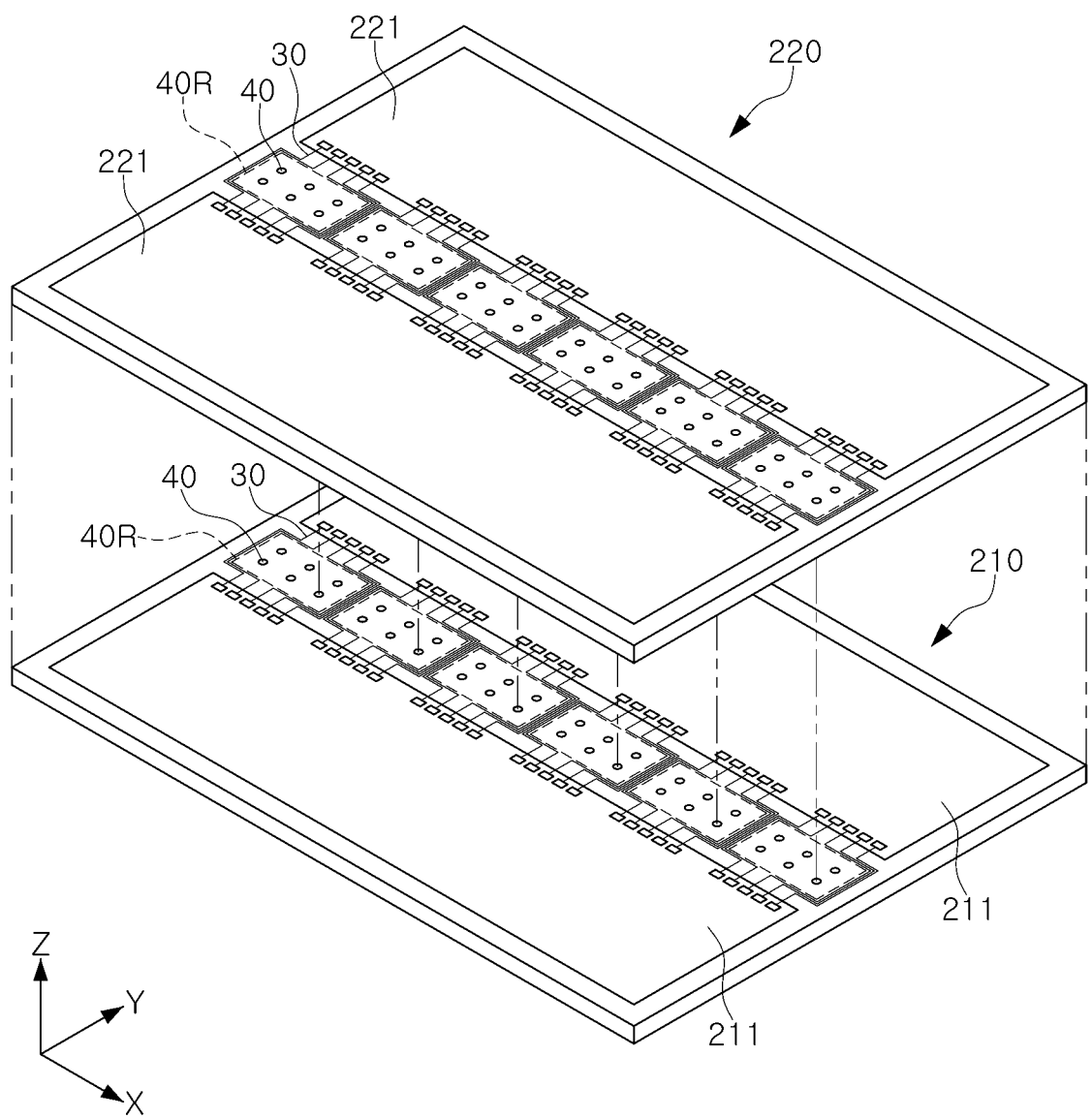
FIG. 7 is a perspective view illustrating a semiconductor device according to an embodiment of the present inventive concepts.

FIG. 7 is a perspective view illustrating a semiconductor device 200 according to an embodiment of the present inventive concepts.

Referring to the embodiment of FIG. 7, the semiconductor device 200 may include a plurality of semiconductor devices, such as first and second semiconductor devices 210 and 220, that are stacked (e.g., in the Z direction) and interconnected through a TSV structure 40. In an embodiment, the plurality of semiconductor devices, such as the first and second semiconductor devices 210 and 220, may be logic chips including first and second logic circuits 211 and 221. In an embodiment, the plurality of semiconductor devices, such as the first and second semiconductor devices 210 and 220, may include a processor such as an image signal processor (ISP), a storage element such as SRAM, a register, a voltage, a timing and/or a signal generator, an output buffer, an amplifying circuit, or a variety of other common logic circuits. In an embodiment, the first logic circuit 211 of the first semiconductor device 210 may include a CPU circuit, and the second logic circuit 221 of the second semiconductor device 220 may include an input/output circuit, an analog circuit or an SRAM circuit.

Figure 8:
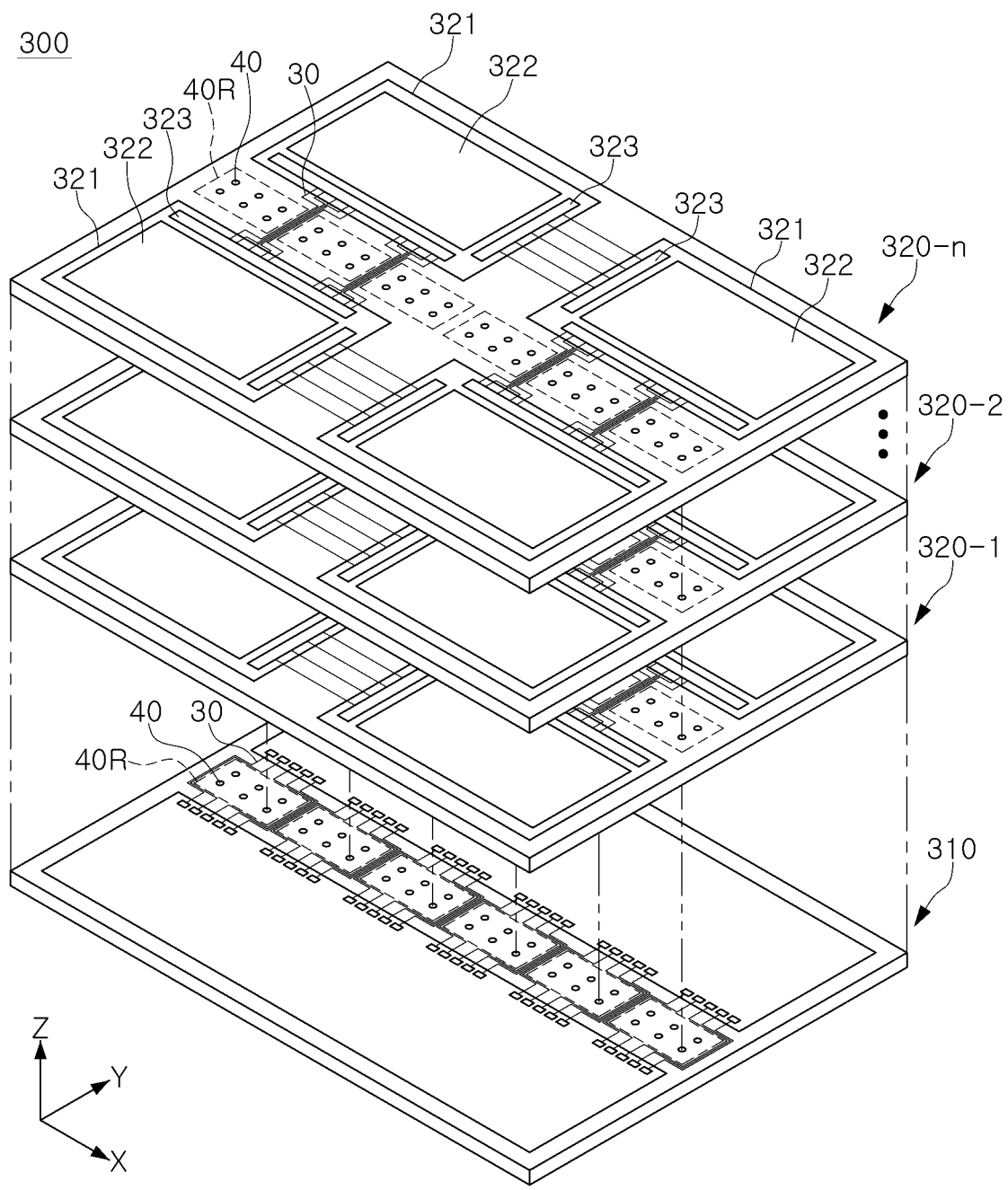
FIG. 8 is a perspective view illustrating a semiconductor device according to an embodiment of the present inventive concepts.

FIG. 8 is a perspective view illustrating a semiconductor device 300 according to an embodiment of the present inventive concepts.

Referring to the embodiment of FIG. 8, the semiconductor device 300 may include a first semiconductor device 310 and a plurality of second semiconductor devices 320-1, 320-2 and 320-n that are stacked on the first semiconductor device 310 (e.g., in the Z direction), which are interconnected through a TSV structure 40. The second semiconductor devices 320-1, 320-2 and 320-n may each include an integrated circuit 321 including a memory block 322 and a peripheral circuit 323.

In an embodiment, the first semiconductor device 310 may be a logic chip, and the plurality of second semiconductor devices 320-1, 320-2 and 320-n may be memory chips including a memory cell. While the embodiment of FIG. 8 shows the plurality of second semiconductor devices 320-1, 320-2, 320-n including three layers, the plurality of second semiconductor devices 320-1, 320-2 and 320-n may have a larger number of layers. As shown in the embodiment of FIG. 8, the plurality of second semiconductor devices 320-1, 320-2 and 320-n may be arranged in the Z direction (e.g., a vertical direction), or may also be arranged it combination form of the Z direction and a horizontal direction (e.g., the X and/or Y directions).

In an embodiment, the plurality of second semiconductor devices 320-1, 320-2 and 320-n may store or output data based on an address command and a control command transmitted from the first semiconductor device 310. For example, the plurality of second semiconductor devices 320-1, 320-2 and 320-n may be DRAM, SRAM, or flash memory chips.

Figure 9:
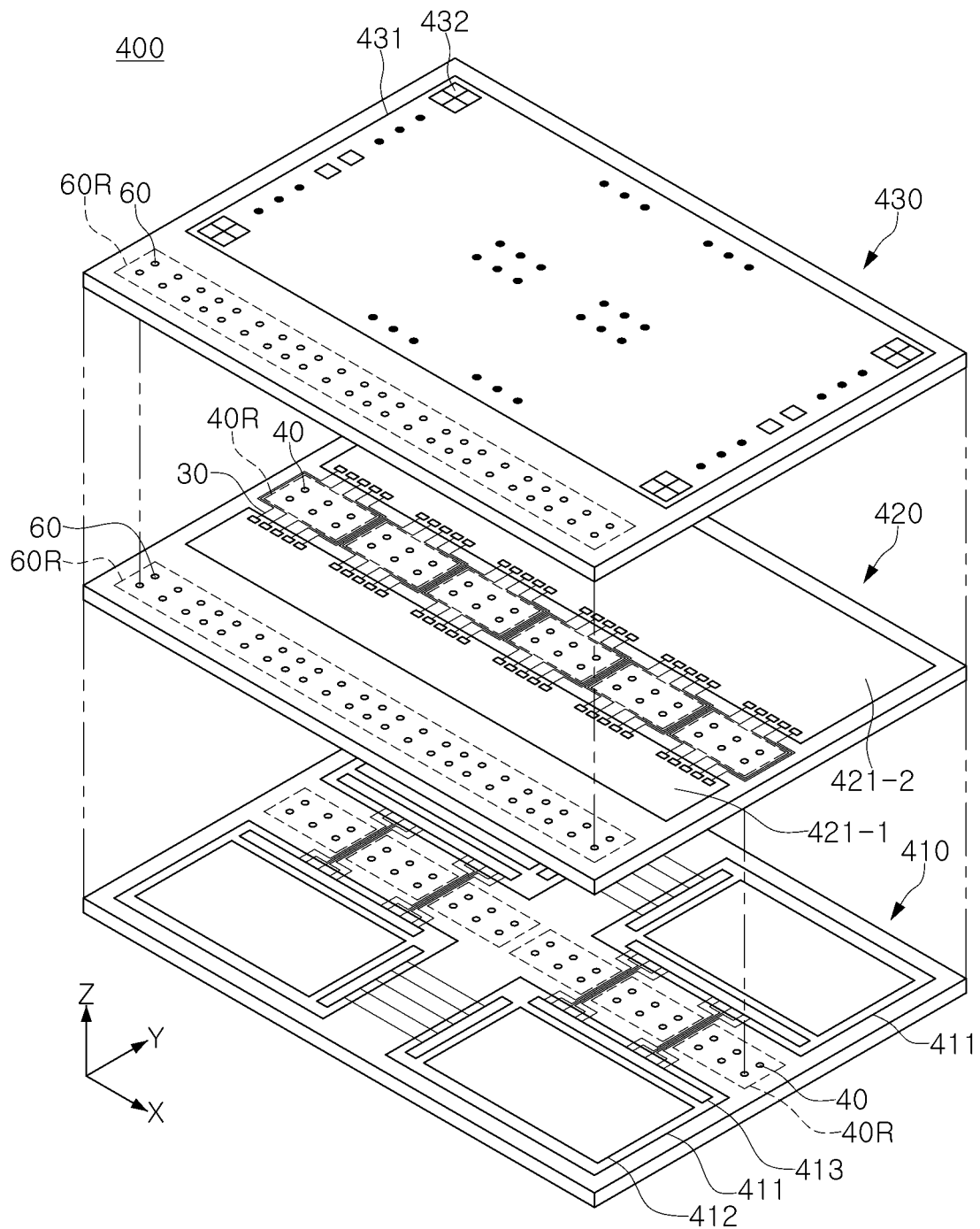
FIG. 9 is a perspective view illustrating a semiconductor device according to an embodiment of the present inventive concepts.

FIG. 9 is a perspective view illustrating a semiconductor device 400 according to an embodiment of the present inventive concepts Referring to the embodiment of FIG. 9, the semiconductor device 400 may include a first semiconductor device 410, a second semiconductor device 420, and a third semiconductor device 430, which are stacked in the Z direction.

In an embodiment, the first semiconductor device 410 may include a plurality of central TSV areas 40R spaced apart from each other (e.g., in the X direction), and an integrated circuit 411 including a memory block 412 and a peripheral circuit 413 electrically connected to the memory block 412. In an embodiment, the memory block 412 may include storage devices such as, for example, a metal-insulator-metal (MIM) capacitor, a charge trap device, a magnetic tunnel junction (MTJ) device, and a germanium (Ge)-antimony (Sb)-tellurium(Te) (GST) device. The first semiconductor device 410 may be electrically connected to the second semiconductor device 420 through a plurality of central TSV structures 40.

The second semiconductor device 420 may include an edge TSV area 60R including a plurality of edge TSV structures 60, a plurality of central TSV areas 40R including a plurality of central TSV structures 40, a first logic circuit 421-1 and a second logic circuit 421-2. The second semiconductor device 420 may be electrically connected to the third semiconductor device 430 through the edge TSV structure 60. In an embodiment, the first logic circuit 421-1 may include a row driver, a readout circuit, a column driver, and control logic required to drive a pixel array 431 of the third semiconductor device 430. The second logic circuit 421-2 may include a power circuit, an input/output interface, an image signal processing circuit, and the like. The area and arrangement form occupied by each of the first and second logic circuits 421-1 and 421-2 may be variously modified.

The third semiconductor device 430 may include an edge TSV area 60R in which the edge TSV structures 60 are arranged, and the pixel array 431 in which a plurality of pixels 432 are arranged. The edge TSV area 60R of the third semiconductor device 430 may overlap (e.g., in the Z direction) the edge TSV area 60R of the second semiconductor device 420. The third semiconductor device 430 may be electrically connected to the second semiconductor device 420 through the edge TSV structure 60. The pixel array 431 may be connected to the first and second logic circuits 421-1 and 421-2 through a plurality of row lines and a plurality of column lines.

Figure 10:
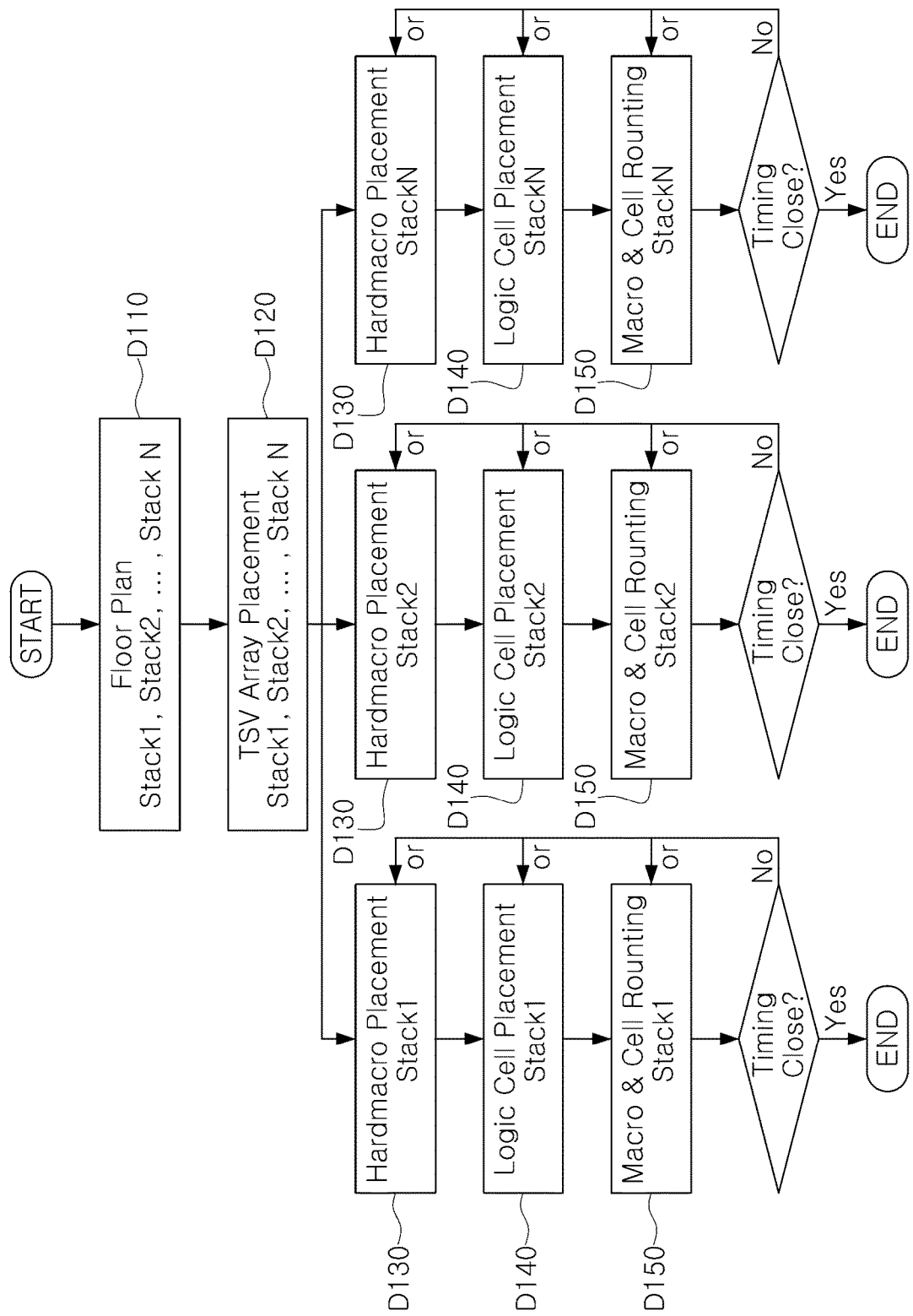
FIG. 10 is a flowchart illustrating a method of designing a 3-dimensional semiconductor device according to an embodiment of the present inventive concepts.

FIG. 10 is a flowchart illustrating a method of designing, a 3D semiconductor device according to an embodiment of the present inventive concepts.

Referring to FIG. 10, a method of designing a 3D semiconductor device according to an embodiment of the present inventive concepts may include determining positions of an input/output area, a first integrated circuit area, a second integrated circuit area, a first TSV area, and a second TSV area within respective areas of a plurality of semiconductor devices in block D110. A plurality of first TSV structures and a plurality of second TSV structures, respectively, are disposed in the 3D semiconductor device in block D120. A hard macro is disposed in the 3D semiconductor device in block D130. A plurality of first cells and a plurality of second cells, respectively, are disposed in the 3D semiconductor device in block D140. At least portions of the hard macro are electrically connected with the plurality of first cells and the plurality of second cells in block D150.

The operation of determining the positions of the input/output area, the first integrated circuit area, the second integrated circuit area, the first TSV area, and the second TSV area performed in block D110 is a floor plan operation in which blocks of a netlist are roughly disposed on a chip to reduce the use area of a semiconductor device. In an embodiment, the positions of the input/output area, the first integrated circuit area, the second integrated circuit area, the first TSV area, and the second TSV area may be determined within respective areas of a plurality of semiconductor devices (e.g., stack 1, stack 2, . . . stack N) constituting a three-dimensional semiconductor device. Within the area of each of the semiconductor devices (e.g., stack 1, stack 2, . . . stack N), the first integrated circuit area and the second integrated circuit area are spaced apart from each other, and the first TSV area and the second TSV area may be disposed between the first integrated circuit area and the second integrated circuit area.

Respectively disposing the plurality of first TSV structures and the plurality of second TSV structures performed in block D120 may include disposing the plurality of first TSV structures and the plurality of second TSV structures in the first TSV area and the second TSV area of each of the semiconductor devices (e.g., stack 1, stack 2, . . . stack N), in a matrix form, respectively. Among the plurality of first TSV structures, a first TSV structure disposed on an outer side may be spaced apart from the first TSV area by a first distance (e.g., spaced apart the first distance in each of the X and Y directions). Among the plurality of second TSV structures, a second TSV structure disposed on an outer side may be spaced apart from the second TSV area by a second distance (e.g., spaced apart the second distance in each of the X and Y directions). In an embodiment, an interval between the first TSV area and the second TSV area between which the wiring structure passes without extending within the first and second TSV areas may be less than or equal to the first distance and the second distance.

The operation of disposing the hard macro performed in block D130 is an operation of disposing a hard macro or a hard block in the first integrated circuit area and the second integrated circuit area of each of the semiconductor devices (e.g., stack 1, stack 2, . . . stack N). "Macro" is a functional circuit element or building block of logic that may be used in the fabrication of an ASIC or FPGA. "Hard macro" may mean a fixed wiring pattern that cannot be changed in physical implementation. On the other hand, "soft macro" does not specify a wiring pattern, and thus, has flexibility in physical implementation. The hard macro is, for example, an area in which an analog circuit block, SRAM, CPU, and the like are formed, and may be formed separately from the standard cell area.

The operation of disposing the plurality of first cells and the plurality of second cells performed in block D140 may be an operation of disposing first cells and second cells in the first integrated circuit area and the second integrated circuit area of each of the semiconductor devices (e.g., stack 1, stack 2, . . . stack N), respectively, in a manner so that the first cells and the second cells do not overlap the hard macro. In an embodiment, the plurality of first cells may be disposed on an outer edge of the first integrated circuit area to be adjacent to the first TSV area and the second TSV area, and the plurality of second cells may be disposed on an outer edge of the second integrated area to be adjacent to the first TSV area and the second TSV area. Each of the plurality of first cells and the plurality of second cells may include a logic cell.

The operation of electrically connecting at least some of the hard macro, the plurality of first cells, and the plurality of second cells performed in block D150 is a step of routing a hard macro, a plurality of first cells, and a plurality or second cells within each of the semiconductor devices (e.g., stack 1, stack 2, . . . stack N), using a wiring structure that passes between the first TSV area and the second TSV area of each of the semiconductor devices (stack 1, stack 2, . . . stack N) without extending within the first TSV area or the second TSV area. Thereafter, in an embodiment in which the required operation speed is not initially satisfied, by measuring the timing (e.g., a clock speed) of respective semiconductor devices (e.g., stack 1, stack 2, . . . stack N), operation "D130", "D140", or "D150" may be performed again. Timing may be measured in Hertz (Hz), which is the number of clock cycles per second.

In an embodiment, a total length of the wiring path may be shortened by interconnecting cells in the first integrated circuit area and the second integrated circuit area by using a wiring structure passing between the first TSV area and the second TSV area. Therefore, a delay phenomenon caused by bypass of the wiring may be significantly reduced.

As set forth above, according to embodiments of the present inventive concepts, a semiconductor device having an increased communication speed and a method of designing a semiconductor device may be provided by introducing a wiring structure passing between TSVs.

While embodiments of the present inventive concepts have been illustrated and described above, it will be apparent to those skilled in the art that modifications and variations could be made without departing from the scope of the present inventive concepts as defined by the appended claims.

What is claimed is:

1. A semiconductor device comprising:
a first integrated circuit and a second integrated circuit disposed on a semiconductor substrate and spaced apart from each other;
a wiring structure disposed on the semiconductor substrate and configured to electrically connect the first integrated circuit and the second integrated circuit; and
a first TSV area and a second TSV area disposed between the first integrated circuit and the second integrated circuit, and including a plurality of first and second TSV structures penetrating through the semiconductor substrate, respectively,
wherein, on a plane, the semiconductor substrate has a TSV array region disposed between the first integrated circuit and the second integrated circuit, and extending in a first direction,
wherein, on the plane, the first TSV area and the second TSV area are spaced apart from each other in the first direction within the TSV array region, and
wherein on the plane the wiring structure extends from the first integrated circuit to the second integrated circuit and passes between the first TSV area and the second TSV area in a second direction perpendicular to the first direction.

2. The semiconductor device of claim 1, wherein:
the first TSV area and the second TSV area are spaced apart in the first direction parallel to an upper surface of the semiconductor substrate;
the plurality of first TSV structures are arranged in an m×n matrix form; and
the plurality of second TSV structures are arranged in an i×j matrix form,
wherein the m and the i are a number of the plurality of first TSV structures and a number of the plurality of second TSV structures arranged in the first direction, and
wherein the n and the j are a number of the plurality of first TSV structures and a number of the plurality of second TSV structures arranged in the second direction that is parallel to an upper surface of the semiconductor substrate, respectively.

3. The semiconductor device of claim 2, wherein:
the m and the i are different integers that are each greater than or equal to 2; and
the n and the j are a same integer that is greater than or equal to 2.

4. The semiconductor device of claim 2, wherein:
the m and the i are a same integer that is greater than or equal to 2; and
the n and the j are different integers that are each greater than or equal to 2.

5. The semiconductor device of claim 1, wherein:
the first integrated circuit includes a plurality of first logic cells; and
the second integrated circuit includes a plurality of second logic cells,
wherein the wiring structure is configured to electrically connect the plurality of first logic cells and the plurality of second logic cells.

6. The semiconductor device of claim 1, wherein:
the first integrated circuit includes a first memory block and a first peripheral circuit that is configured to be electrically connected to the first memory block; and
the second integrated circuit includes a second memory block and a second peripheral circuit that is configured to be electrically connected to the second memory block,
wherein the wiring structure is configured to electrically connect the first peripheral circuit and the second peripheral circuit.

7. The semiconductor device of claim 1, wherein:
the first TSV area is an area defined within a first distance from a first first TSV structure that is disposed on an outer side among the plurality of first TSV structures; and
the second TSV area is an area defined within a second distance from a first second TSV structure that is disposed on an outer side among the plurality of second TSV structures.

8. The semiconductor device of claim 7, wherein:
the first TSV area and the second TSV area are spaced apart by an interval;
the wiring structure passes through the interval without extending within the first TSV area or the second TSV area; and
the interval is less than or equal to each of the first distance and the second distance.

9. The semiconductor device of claim 7, wherein:
the semiconductor device further includes a decoupling capacitor disposed in the first TSV area and the second TSV area,
wherein the decoupling capacitor includes at least one transistor selected from a planar transistor, a recess channel array transistor (RCAT), and a buried cell array transistor (BCAT).

10. The semiconductor device of claim 7, wherein:
the semiconductor device further includes a dummy cell disposed in the first TSV area and the second TSV area,
wherein the dummy cell is insulated from the first integrated circuit and the second integrated circuit.

11. The semiconductor device of claim 7, wherein the first distance and the second distance are in a range of about 20 µm to about 40 µm.

12. The semiconductor device of claim 1, wherein the plurality of first TSV structures and the plurality of second TSV structures are arranged at a substantially same pitch.

* * * * *